United States Patent [19]
Schäfer

[11] 3,947,303
[45] Mar. 30, 1976

[54] METHOD FOR PRODUCING A SURFACE STABILIZING PROTECTIVE LAYER IN SEMICONDUCTOR DEVICES

[75] Inventor: Horst Schäfer, Zirndorf, Nurnberg, Germany

[73] Assignee: Semikron, Gesellschaft fur Gleichrichterbau und Elektronik m.b.H., Nurnberg, Germany

[22] Filed: Mar. 10, 1975

[21] Appl. No.: 556,867

[30] Foreign Application Priority Data
July 30, 1974 Germany............................ 2436600

[52] U.S. Cl. ...................... 156/3; 156/17; 156/247; 156/297
[51] Int. Cl.² ...................... H01L 7/50; B32B 31/00
[58] Field of Search ........................... 29/589–591; 156/3, 7, 17, 297, 299, 247, 249

[56] References Cited
UNITED STATES PATENTS

| | | | |
|---|---|---|---|
| 3,690,984 | 9/1972 | Wanesky............................ | 156/17 X |
| 3,706,409 | 12/1972 | Lederer............................ | 29/589 X |
| 3,739,463 | 6/1973 | Aird et al......................... | 29/591 X |
| 3,766,638 | 10/1973 | Moore............................... | 29/574 X |
| 3,888,053 | 6/1975 | White et al....................... | 156/297 X |

*Primary Examiner*—William A. Powell
*Attorney, Agent, or Firm*—Spencer & Kaye

[57] ABSTRACT

An improved method for producing a layer of a protective lacquer, which improves the blocking properties and stabilizes the surface of a semiconductor device, on the edge surface of a semiconductor body in the region where the pn-junction or junctions of the device formed in the body exit to the surface, wherein the semiconductor wafers are applied, at mutual spacings appropriate for their further processing, to a plastic support layer which is heated until it softens, after cooling of the support a protective lacquer is introduced in the spaces between the semiconductor wafers to enclose the pn-junction(s) coming to the surface, and after hardening of the protective lacquer the lacquer foil formed thereby together with the semiconductor wafers embedded therein is removed from the support. According to the invention, the plastic layer is initially placed onto the surface of a metallic base plate which is provided with planar raised portions; the semiconductor wafers have surfaces conforming to the surface of these raised portions and are placed thereon; the plastic support produces an adhesive connection between the semiconductor wafers and the base plate but does not enter a firm bond with the protective lacquer; and the protective lacquer foil is removed from the support after the support layer has been heated to a temperature which causes same to soften.

5 Claims, 2 Drawing Figures

METHOD FOR PRODUCING A SURFACE STABILIZING PROTECTIVE LAYER IN SEMICONDUCTOR DEVICES

BACKGROUND OF THE INVENTION

The present invention relates to an improved method for producing a layer of a protective lacquer, which improves the blocking properties and stabilizes the surface of a semiconductor device on the edge surface of a semiconductor device in the region where the pn-junction or junctions of the device exit. More particularly the present invention relates to an improved method for providing such a protective lacquer layer wherein a plurality of semiconductor wafers is placed, in a mutual spacing which is appropriate for their further processing, so that one of the contact or major surfaces of each wafer is on a planar support made of plastic material, the plastic material is then heated until it becomes soft and then permitted to cool so as to hold the wafers in place, thereafter a protective lacquer is introduced between the semiconductor wafers which lacquer encloses the pn-junction(s) coming to the surface, and finally the lacquer foil which forms after hardening of the protective lacquer together with the semiconductor wafers embedded therein is removed from the support.

In the production of semiconductor devices, particularly semiconductor rectifier devices with a high blocking voltage carrying capability, it is particularly important to cover the semiconductor surface in the region where the pn-junction(s) exit with a substance which protects the surface against environmental influences and which improves and stabilizes the electrical properties of the device, particularly the blocking properties.

A method for producing a protective coating on semiconductor surfaces is known according to which semiconductor wafers are arranged in large numbers and at mutual spacings with one of their surfaces on a planar support of plastic material which has been heated beyond its softening point and, after cooling of the support, a protective lacquer which improves the blocking properties and stabilizes the semiconductor surface is introduced in liquid form between the semiconductor wafers. After hardening, this protective lacquer forms a continuous foil which encloses the semiconductor wafers in the region where the pn-junction exits and is then removed from the support together with the semiconductor wafers. The semiconductor wafers intended for this treatment each preferably comprises a disc-shaped semiconductor body having a metallic contact plate fastened to each of its two major surfaces.

In this known process, the semiconductor wafers may sink into the softened plastic support beyond the pn-junction to be protected. This has the result that after removal from the support the respective surface region of the semiconductor wafers is unprotected and may be subjected to damaging influences from the environment. Moreover, large-area semiconductor wafers cannot be fixed in the desired manner in the support due to the greatly varying coefficients of thermal expansion of the wafer contact material and the material of the support so that after cooling of the support the wafers often lie only loosely on top of the support and the protective lacquer, when it is being applied, may creep under the edge zones of the contact areas where electrical contact is to be made. This leads to undesirable wetting of the contact surface and requires additional work. Finally, when the semiconductor wafers are removed from the support according to the known process, there exists the danger that due to insufficient adhesion to the wafer periphery the protective lacquer foil will tear away from the surface it is to protect so that expensive additional treatment of the semiconductor wafers becomes necessary.

SUMMARY OF THE INVENTION

It is the object of the present invention to improve the known process so that semiconductor wafers of any size, and with or without metallic contact plates, can be provided with a permanent protective coating in certain surface regions at the point of exit of the pn-junction(s).

This is accomplished according to the present invention in that in a method as described above the plastic support layer is initially placed as a coating on the surface of a metallic base plate which is provided with planar raised portions whose shape or area conforms to that of the surface of the semiconductor wafers; the wafers are placed on these raised portions; the plastic support forms an adhesive connection between the semiconductor wafers and the base plate but does not enter into a firm bond with the protective lacquer; and the protective lacquer foil with the embedded wafers is removed from the support after heating the support to a temperature at which it softens.

DESCRIPTION OF THE PREFERRRED EMBODIMENTS

Figure 1:
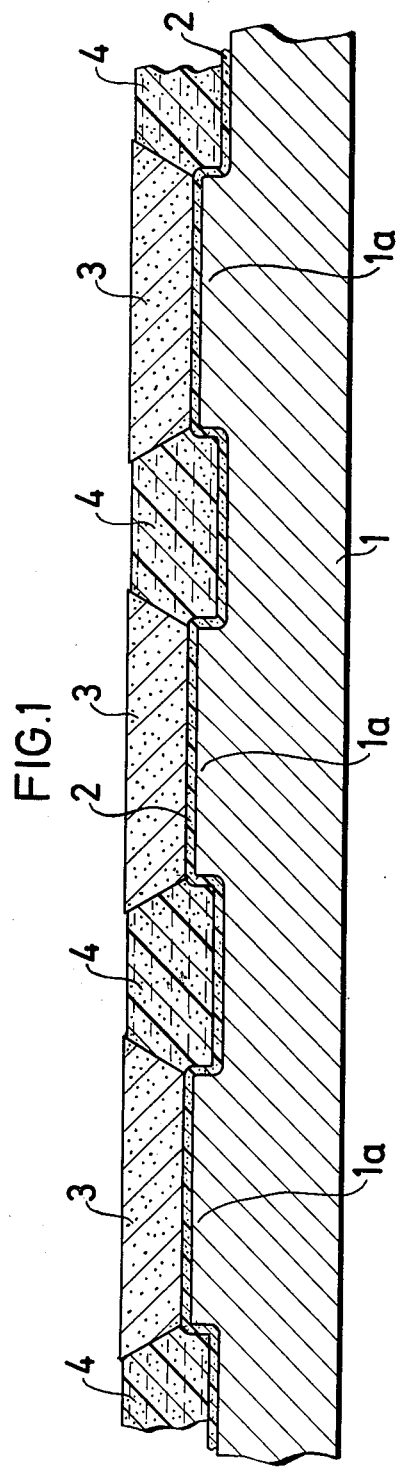
FIG. 1 is a sectional view showing semiconductor wafers on a support and the protective lacquer layer enclosing the semiconductor wafers according to the method of the present invention.

Referring now to FIG. 1 there is shown a metallic base plate 1 having a plurality of planar raised portions 1a on at least one surface thereof. On each of these raised portions 1a, a semiconductor wafer 3 is placed with one of its contact surfaces. In order to fix or hold the semiconductor wafers 3 on the respective raised portions 1a, a coating or layer 2 of a plastic which acts as an adhesive is applied to the surface of the base plate 1. A surface stabilizing protective layer is introduced into the interstices between the semiconductor wafers 3 to enclose the semiconductor wafers along their superficies or edge surfaces 5 and forms a continuous layer 4 of lacquer which is determined in its areal expanse by that of the base plate 1. This layer 4 will hereinafter be identified as a lacquer foil.

The expanse of the base plate 1 is determined only by technical considerations for the further processing of the semiconductor wafers 3 which are fixed in the illustrated manner.

Since before application of the protective lacquer the surfaces 5 to be protected of the semiconductor wafers which have been fixed on the base plate 1 must be cleaned with the aid of etching processes, it is necessary to make the base plate 1 of a metal which is resistant to the specific etching solution required to treat the semiconductor material. For example, stainless steel, as may be used as the material for the base plate and an etching solvent, which is known in the semiconductor art as chemical polish No. 4 for the etching treatment of silicon may be used. This etching solvent consists of 25 volume parts nitric acid, 15 volume parts hydrofluoric acid, 15 volume parts acetic acid each volume part concentrated and 0.3 volume parts bromine.

The raised portions 1a of the base plate 1 each have an areal expanse and shape which conforms to that of the contact surface of the respective wafer placed thereon. Additionally, the raised portions 1a of a base plate 1 may have different areal expanses and shapes in order to permit the arrangement of semiconductor wafers of different sizes and shapes and may be arranged in various patterns, for example, in rows and columns or in concentric circles. Although all raised portions 1a have the same height, the height itself, however, is not critical. It must only be assured that all shapes of semiconductor wafers, particularly those with oblique or chamfered edges to optimize the blocking voltage carrying capability which are arranged on the base plate so that the oblique portion is directed toward the base plate, can be covered with the desired protective lacquer at every point on their surface areas which are desired to be covered. This applies in particular to semiconductor wafers having four layers of alternatingly opposite conductivity types as they are used, for example, for thyristors, and in which the tapered edge zones are known to be particularly flat in the region in question. If such semiconductor wafers were placed with the larger of their two contact surfaces onto a base plate without raised portions, there would exist the danger that the free contact surfaces of the semiconductor wafers would undesirably be covered with the lacquer when the protective lacquer is applied.

The mutual spacing of the raised portions 1a and their arrangement are determined by the minimum mutual spacing of the semiconductor wafers permissible for the intended treatment.

The coating 2 applied to the base plate 1 to hold the semiconductor wafers by sticking comprises a material which has a softening point substantially below the melting point of soft solders employed for contacting the semiconductor bodies with contacting plates, and lies preferably in a region between 80° and 150° C. The material for the coating 2 must also be resistant against the specific etching solutions required to treat the semiconductor material and must neither adhere to the surface protection lacquer nor react with its solvent. These requirements are met by the known hot-melt adhesives, e.g. polyethylene waxes.

The protective lacquer may consist, in a known manner, of an electrically insulating substance which adheres well to the semiconductor material, for example, a caothchouc which serves as the carrier substance if an additive of suitable type is added to produce the desired stablizing properties. The solvent for the protective lacquer, due to its very low surface tension, produces a very good wetting of the semiconductor surface. For example, a silicone rubber, as sold by Dow Corning under the designation RTV or by Wacker Chemie, Burghausen, BRD under the designation SK 43, may be applied as carrier substance further, the organic dyestuff fluorescein may be used as an additive to this carrier substance and toluene, may be used as the solvent for a protective lacquer, which is formed by these substances.

According to the method of the invention, the coating 2 is applied by means of spreading, spraying or rolling or by powder coating onto the intended surface of the base plate 1 which hass has provided with the raised portions 1a. If a hot-melt adhesive is present in powdered form it is molten onto the surface of the base plate 1 at the appropriate temperature. The thickness of the coating or layer 2 is not critical. It may be so thin that it is just possible to assure uniform fastening of the semiconductor wafers 3 and may, for example, be 0.5 mm thick. With the aid of known suction devices all of the semiconductor wafers 3 are applied to the raised portions 1a of the wax-coated surface of the base plate. The resulting structure is subsequently heated to a temperature higher than the softening point of coating 2. After cooling, a sufficiently firm connection is achieved for the semiconductor wafers to the coating 2 and the contact surfaces of the semiconductor wafers 3 are tightly covered. The subsequently applied protective lacquer is thus prevented from creeping underneath the semiconductor wafers.

Subsequent to fastening of the semiconductor wafers onto the portions 1a of the base plate 1, the arrangement is subjected to an etching and rinsing process to cleanse the semiconductor surfaces in preparation for the application of the protective lacquer. The protective lacquer is applied in a known manner, e.g., by spraying or casting, into the areas between the raised portions 1a so that it uniformly encloses all of the semiconductor wafers at their superficies and completely wets them. After the protective lacquer has hardened, the structure is again heated to the softening temperature of coating 2 and the polymerized protective lacquer which now forms a contiguous foil 4 containing the semiconductor wafers 3 is removed from the support.

Since the plastic coating 2 is repeatedly melted or softened during the course of the process of the present invention, it must thus consist of a reversibly polymerizable material, e.g., a thermoplastic.

In semiconductor wafers which have been treated in the manner described above and which have one or a plurality of metallized contact surfaces, for example, of nickel or gold, or contact plates which are coated with a solderable coating, the residual coating 2 remaining on the contact surfaces after removal from the base plate has surprisingly not been found to be disadvantageous during subsequent solder contacting.

It is to be understood that the raised portions 1a need not be solid bodies or protrusions but may also be formed as hollow bodies, for example, as annular discs. The areal dimensions determined by the periphery of these hollow bodies then coincide with the surface areas of the associated major surface of the semiconductor wafers whose edge surface is to be covered. The wafers rest merely on the annular surface and can be removed from the base plate 1 with even greater ease.

Figure 2:
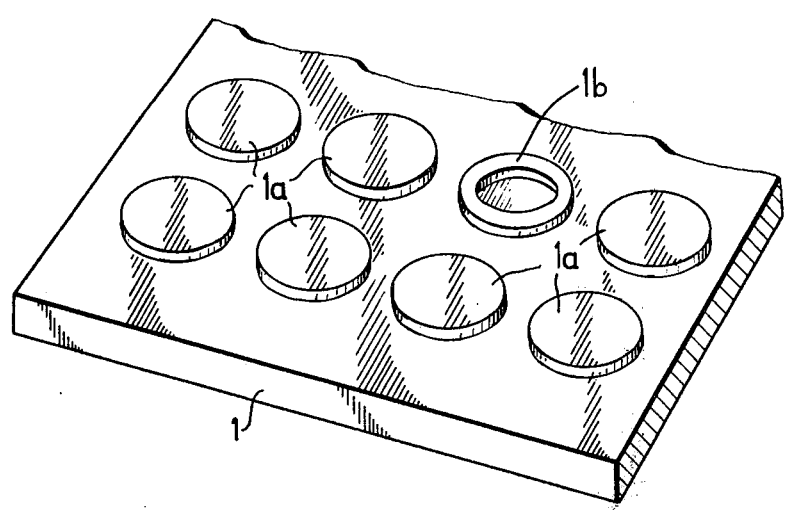
FIG. 2 is a perspective view of an embodiment of a base plate with raised portions for the placement of semiconductor wafers thereon according to the method of the present invention.

FIG. 2 shows an embodiment of a base plate 1 with an annular-disc-shaped raised portion 1b, as described above, and with raised portions, which are arranged in rows and columns for example.

An arrangement of semiconductor wafers produced according to the process of the present invention can be utilized in many ways. If the arrangement is mounted in appropriate devices, or jigs, prepared semiconductor wafers can be etched, rinsed and provided with metallic contact coatings simultaneously in large numbers during passage through the respective production machinery. When a substance is used for the protective lacquer which substance is resistant to the respective subsequent treatment substances, it is also possible to subsequently contact and encapsulate the semiconductor wafers which have been fixed according to the present invention.

Passivation of the contact surfaces occurring during storage of the semiconductor wafers can be avoided, for example, by simultaneously appling a metallic coating of a low-melting solder to all contact surfaces of an arrangement of a plurality of wafers produced according to the present invention by immersion or according to one of the other known soldering processes for soldering conductor plates. In the mass production of semiconductor devices with low current carrying capability, the simultaneous application of current leads to a larger number of pretreated semiconductor wafers can be advantageously effected, if required with the interposition of contacting rings, in that only one or two rows of semiconductor wafers of an arrangement produced according to the present invention are inserted into the appropriate apparatus and subsequently each of the semiconductor wafers is clamped between two conducting leads and then contacted in an immersion soldering process.

With the aid of an arrangement produced according to the present invention including one or two rows of semiconductor wafers, semiconductor arrangements with two or more semiconductor wafers in a certain mutual arrangment can be produced by simultaneously placing a plurality of semiconductor wafers on a desired number of appropriately lined-up housing supports of metal or metallized ceramic, connecting the wafers to the supports and mutually interconnecting the wafers by means of further conductive leads connected thereto.

The advantage of the process according to the invention is that a coating of a protective lacquer can be applied simultaneously and surprisingly easily and economically to a plurality of individual semiconductor wafers with the desired edge contour on their surfaces in the region where the pn-junction(s) exit, so that the complete wetting of the critical surface areas of the semiconductor wafers with the protective lacquer is assured.

The arrangement produced according to the present invention can be used with particular advantage for the simultaneous and economical processing of a large number of semiconductor wafers during the manufacture of semiconductor arrangements and also permits a favorable and very economical storage of prefabricated semiconductor wafers within a manufacturing schedule.

It will be understood that the above description of the present invention is susceptible to various modifications, changes and adaptations, and the same are intended to be comprehended within the meaning and range of equivalents of the appended claims.

I claim:

1. In a method for producing a layer of protective lacquer on the edge surface of a semiconductor wafer in the region where the pn-junction or junctions formed in the wafer exit including the steps of: placing a plurality of semiconductor wafers, at mutual spacings appropriate for their further processing, on a plane support layer of plastic material which softens when heated so that one major surface of each wafer contacts the support layer; heating the support layer until it softens; after cooling same introducing a protective lacquer into the spaces between the semiconductor wafers to enclose the edge surfaces of the wafers in the regions where the pn-junctions exit; after hardening the protective lacquer to form a contiguous lacquer foil removing the lacquer foil together with the semiconductor wafers embedded therein from the support layer; the improvement wherein: said method further comprises the steps of providing a metallic base plate having a plurality of raised planar portions on one surface thereof with the raised portions having said mutual spacings and a surface area which conforms to the said major surface of the semiconductor wafers, and applying said support layer to said one surface of said metallic base plate prior to said step of placing; said step of placing includes placing each of said wafers on one of said raised portions; said plastic material produces an adhesive connection between the semiconductor wafers and the base plate but does not enter into a firm bond with the protective lacquer; and said step of removing includes heating the plastic material of the support layer to a temperature sufficient to cause same to again soften.

2. A method as defined in claim 1 wherein said plastic material is a hot-melt adhesive.

3. A method as defined in claim 1 further comprising: just prior to said step of introducing, cleaning the edge surfaces of said wafers by subjecting same to an etching solution; and wherein the material used for the base plate is resistant to said etching solution.

4. A method as defined in claim 1 wherein the raised portions on the base plate are arranged in rows and columns.

5. A method as defined in claim 4 wherein the raised portions are annular discs.

* * * * *